(12) United States Patent
Wicks et al.

(10) Patent No.: US 11,937,393 B2
(45) Date of Patent: Mar. 19, 2024

(54) CIRCUIT BOARD ASSEMBLY AND SYSTEM FOR COMMUNICATION TO AN ACCESS POINT OF AN AVIONICS NETWORK

(71) Applicant: ARINC Incorporated, Annapolis, MD (US)

(72) Inventors: Curtis Wicks, Deerfield Beach, FL (US); Rameshkumar Balasubramanian, Apple Valley, MN (US); Ryan M. Kollman, Saint Paul, MN (US); Stephen Welch, Minneapolis, MN (US)

(73) Assignee: ARINC Incorporated, Annapolis, MD (US)

( * ) Notice: Subject to any disclaimer, the term of this patent is extended or adjusted under 35 U.S.C. 154(b) by 205 days.

(21) Appl. No.: 17/563,354

(22) Filed: Dec. 28, 2021

(65) Prior Publication Data
US 2023/0156951 A1    May 18, 2023

(30) Foreign Application Priority Data
Nov. 16, 2021  (IN) .............................. 202141052524

(51) Int. Cl.
*H05K 1/14* (2006.01)
*B64C 1/36* (2006.01)
(Continued)

(52) U.S. Cl.
CPC ................. *H05K 7/10* (2013.01); *B64C 1/36* (2013.01); *B64D 41/00* (2013.01); *H01Q 1/2258* (2013.01);
(Continued)

(58) Field of Classification Search
CPC .... H05K 1/14; H05K 1/141–144; H05K 1/18; H05K 7/00; H05K 7/12; H05K 7/14;
(Continued)

(56) References Cited

U.S. PATENT DOCUMENTS 6,377,471 B1 *  4/2002  Chong, Jr. ........... H05K 7/1439
                                              439/62
6,644,979 B2 * 11/2003  Huang .................... G06F 1/184
                                              439/60

(Continued)

FOREIGN PATENT DOCUMENTS

CN         102866977 A    1/2013
CN         213305856 U    5/2021

*Primary Examiner* — Tuan T Dinh
(74) *Attorney, Agent, or Firm* — Suiter Swantz pc llo

(57) ABSTRACT

A circuit card assembly is described. The circuit card assembly adapts a host circuit card assembly of a host device with an expansion card. By such adaption, the host device may communicate with an access point of an avionics network. The circuit card assembly includes an interface for receiving power from the host circuit card assembly. The circuit card assembly then continuously and selectively provides power to a second interface based on the availability of aircraft power. The second interface receives the expansion card. The circuit card assembly also includes one or more coaxial RF connectors for receiving modulated signals from the expansion card. The circuit card assembly also includes an antenna which transmits radio waves based on the modulated signals. A system for communication to an access point of an avionics network includes the circuit card assembly.

15 Claims, 7 Drawing Sheets

(51) Int. Cl.
*B64D 41/00* (2006.01)
*H01Q 1/22* (2006.01)
*H01Q 1/42* (2006.01)
*H04B 1/40* (2015.01)
*H05K 1/18* (2006.01)
*H05K 7/10* (2006.01)
*H01R 12/73* (2011.01)
*H05K 7/12* (2006.01)

(52) U.S. Cl.
CPC ................ H01Q 1/42 (2013.01); H04B 1/40 (2013.01); H05K 1/144 (2013.01); H05K 1/18 (2013.01); *H01R 12/73* (2013.01); *H05K 7/12* (2013.01); *H05K 2201/09063* (2013.01); *H05K 2201/10037* (2013.01); *H05K 2201/10098* (2013.01); *H05K 2201/10189* (2013.01); *H05K 2201/2036* (2013.01)

(58) Field of Classification Search
CPC .......... H05K 2201/10037; H05K 2201/10098; H04B 1/40; B64C 1/36; B64D 41/00
USPC ........................ 361/770–790, 803, 807–810; 257/660–690
See application file for complete search history.

(56) References Cited

U.S. PATENT DOCUMENTS

| | | | | |
|---|---|---|---|---|
| 6,805,560 | B1* | 10/2004 | Budny | H01R 12/52 439/65 |
| 7,155,258 | B1* | 12/2006 | Cisar | H04B 1/005 455/562.1 |
| 7,309,260 | B2 | 12/2007 | Brower et al. | |
| 7,539,026 | B2* | 5/2009 | Finnerty | H05K 1/141 361/810 |
| 7,848,115 | B2* | 12/2010 | Casto | H05K 1/14 361/802 |
| 8,568,149 | B1* | 10/2013 | Vackar | H01R 25/006 439/63 |
| 8,585,442 | B2 | 11/2013 | Tuma et al. | |
| 9,591,781 | B2* | 3/2017 | Vanderveen | H05K 1/14 |
| 9,641,203 | B2 | 5/2017 | Azuma | |
| 2003/0125071 | A1* | 7/2003 | Ashley | H01R 24/50 455/561 |

* cited by examiner

CIRCUIT BOARD ASSEMBLY AND SYSTEM FOR COMMUNICATION TO AN ACCESS POINT OF AN AVIONICS NETWORK

CROSS-REFERENCE TO RELATED APPLICATIONS

The present application claims the benefit of India Provisional Patent Application 202141052524, filed Nov. 16, 2021, titled ADAPTER FOR AIRCRAFT WIRELESS MODULE, naming Curtis J Wicks, Rameshkumar Balasubramanian, Ryan Kollman, and Stephen Welch as inventors, which is incorporated herein by reference in the entirety.

TECHNICAL FIELD

The present invention generally relates to circuit card assemblies, and more particularly to adapters for wireless module expansion cards.

BACKGROUND

Wavelength availability, processing capabilities, embedded sensors are drivers in connecting devices by wireless communication networks. Wireless data communication has also proven to be a means of data communication within an aircraft. The aircraft may include hosts which communicate by a wireless interface. Transmission signals for the wireless interface may be modulated by an embedded wireless chip. The embedded wireless chips may provide a compact design which integrates to an avionics host. However, the embedded wireless chips may suffer from an inability to modify the wireless chip after embedding (e.g., for updating legacy avionics hosts). Furthermore, the circuit card assemblies of the host system that need to implement wireless interface need to be redesigned to accommodate the embedded wireless chip and its interfacing electronic circuits. Implementation of the embedded wireless chip may also point design leading to higher development, qualification, and certification cost for the host circuit card assembly.

The transmission signals for the wireless interface may also be modulated by a detachable expansion card. Referring now to FIG. 1, a prior art expansion card 100 is described. The expansion card 100 may be self-contained and interface with the host CCA through an edge connector 102 with a standard card interface, such as PCI, PCIe, or an M.2 form factor. The expansion card may be horizontally or vertically mounted to a socket of the host CCA. The expansion card may further include one or more radios (e.g., a WI-FI radio 104, a Bluetooth low energy radio 106, etc.), integrated sensors 108, memory 110, electrical components 112, one or more coaxial radio frequency (RF) connectors 114, and electromagnetic (EMI) shielding (not depicted). Such radios may also be referred to as radio frequency modules. A number of such expansion cards are commercially-off-the-shelf (COTS). The expansion card may also be referred to as a wireless module. In some instances, the electrical components 112 may implement a real-time clock function. The real-time clock function may provide a real-time clock output for compliance with wireless security protocol and encryption.

Some legacy avionics hosts may not include an interface for directly hosting the expansion card, such as non-networked circuit card assemblies (CCA) for various mechanical devices. Even where the host circuit card assemblies do include a suitable interface for receiving the expansion card, coupling the expansion card with the host circuit card assembly may prove difficult given one or more of the location or orientation of the interface in the host circuit card assembly. Such difficulty may arise due to clearance issues (e.g., components populated on the host CCA, etc.) associated with mounting the expansion card to the interface of the host CCA within the host chassis. In some instances, the legacy avionics host may accommodate the wireless network adapter card with additional modifications to the host assembly or the circuit card assembly. However, such changes may prove cost and time ineffective. Therefore, it would be advantageous to provide one or more of a device, system, or method that cures the shortcomings described above.

SUMMARY

Embodiments of the present disclosure are directed to a circuit card assembly adapting a host circuit card assembly of a host device with an expansion card for communication to an access point of an avionics network. In one embodiment, the circuit card assembly includes a circuit card. In another embodiment, the circuit card includes a first side, a second side, and a plurality of mounting holes for mounting the circuit card assembly to a host chassis of the host device. In another embodiment, the circuit card assembly includes a first interface disposed on the first side of the circuit card for receiving power from the host circuit card assembly. In another embodiment, the circuit card assembly includes a battery disposed on the first side of the circuit card. In another embodiment, the circuit card assembly include a second interface disposed on the first side of the circuit card for receiving an edge connector of the expansion card. In another embodiment, the power is continually provided to the second interface for powering a real-time clock of the expansion card. In another embodiment, a source of the power continually provided to the second interface is selected from the first interface and the battery based on an availability of the power from the first interface. In another embodiment, the second interface is a socket connector. In another embodiment, the circuit card assembly includes at least one coaxial radio frequency connector disposed on the first side of the circuit card for receiving a modulated radio frequency signal modulated by a radio-frequency module of the expansion card. In another embodiment, the circuit card assembly includes an antenna disposed on the second side of the circuit card and communicatively coupled to the at least one coaxial radio frequency connector. In another embodiment, the antenna transmits radio waves based on the modulated radio frequency signal.

Embodiments of the present disclosure are also directed to a system for communication to an access point of an avionics network. In one embodiment, the system includes a host device. In another embodiment, the host device includes a host chassis and a host circuit card assembly fixed to the host chassis. In another embodiment, the host circuit card assembly receives aircraft electrical power. In another embodiment, the system includes an expansion card. In another embodiment, the expansion card includes an edge connector, a real-time-clock, a radio-frequency module, and a first coaxial radio frequency connector. In another embodiment, the radio frequency is configured to generate a modulated radio frequency signal. In another embodiment, the modulated radio frequency signal is output by way of the first coaxial radio frequency connector. In another embodiment, the system includes a coaxial cable. In another embodiment, the system includes a circuit card assembly.

In another embodiment, the circuit card assembly includes a circuit card including a first side, a second side, and a plurality of mounting holes by which the circuit card is mounted to the host chassis. In another embodiment, the circuit card assembly includes a first interface disposed on the first side of the circuit card for receiving power from the host circuit card assembly. In another embodiment, the circuit card assembly includes a battery disposed on the first side of the circuit card. In another embodiment, the circuit card assembly includes a second interface disposed on the first side of the circuit card for receiving the edge connector of the expansion card, wherein power is continually provided to the socket connector for powering the real-time clock of the expansion card, wherein the power is selectively provided from one of the first interface and the battery based on an availability of the power from the first interface. In another embodiment, the circuit card assembly includes a second coaxial radio frequency connector disposed on the first side of the circuit card, wherein the first coaxial radio frequency connector and the second coaxial radio frequency connector are coupled by the coaxial cable such that the second coaxial radio frequency connector receives the modulated radio frequency signal from the radio-frequency module of the expansion card. In another embodiment, the circuit card assembly includes an antenna disposed on the second side of the circuit card and communicatively coupled to the at least one coaxial radio frequency connector, the antenna transmitting radio waves based on the modulated radio frequency signal.

Further Contemplations

Embodiments of the present disclosure are directed to a circuit card assembly adapting a host circuit card assembly of a host device for communication to an access point of an avionics network. In one embodiment, the circuit card assembly includes a circuit card. In another embodiment, the circuit card includes a first side, a second side, and a plurality of mounting holes for mounting the circuit card assembly to a host chassis of the host device. In another embodiment, the circuit card assembly includes a first interface disposed on the first side of the circuit card for receiving power and an unmodulated signal from the host circuit card assembly. In another embodiment, the circuit card assembly includes a radio disposed on the first side of the circuit card. In another embodiment, the power is continually provided to the radio for powering a real-time clock of the radio. In another embodiment, the radio executes a function causing the radio to generate a modulated radio frequency signal. In another embodiment, the circuit card assembly includes an antenna disposed on the second side of the circuit card and communicatively coupled to the radio. In another embodiment, the antenna transmits radio waves based on the modulated radio frequency signal.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

Figure 1:
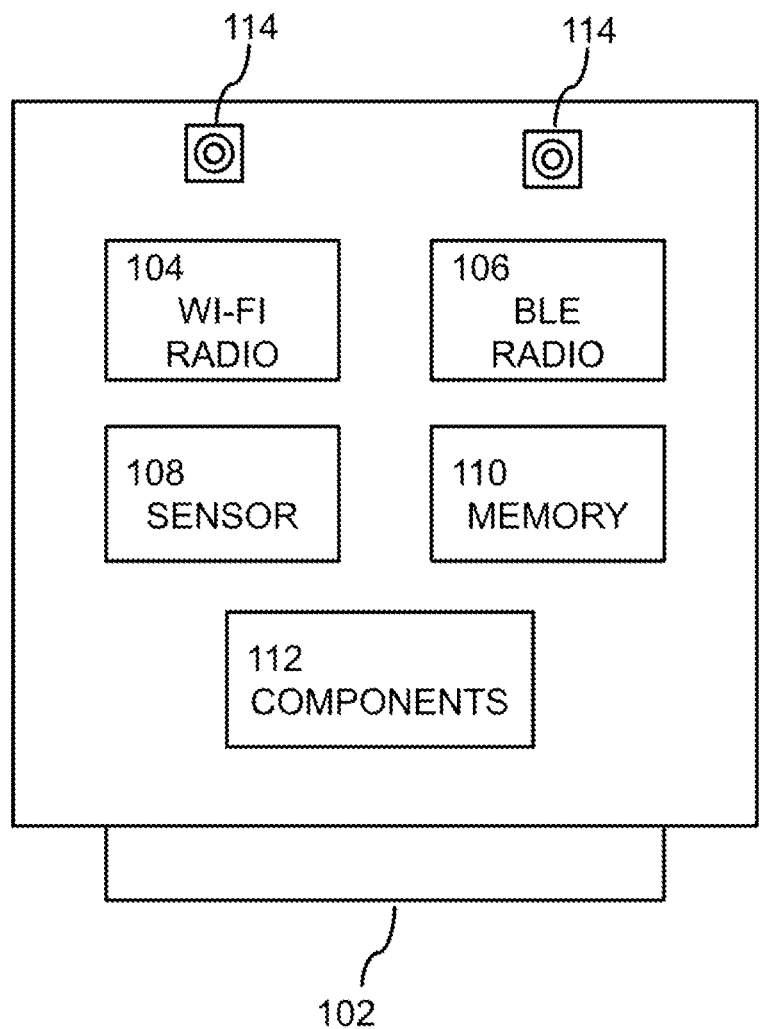
FIG. 1 depicts an expansion card, in accordance with the prior art.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive "or". For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features which may not necessarily be expressly described or inherently present in the instant disclosure.

Embodiments of the present disclosure are generally directed to a circuit card assembly. The circuit card assembly may act as a wireless interface for a host circuit card assembly. The circuit card assembly provides flexibility in mounting an expansion card to the host circuit card assembly in a selected location or orientation. The circuit card assembly may provide such flexible mounting with minimal modification to the host chassis. In this regard, the circuit card assembly may be considered to an adapter which adapts the host circuit card assembly with the expansion card.

Figure 2A:
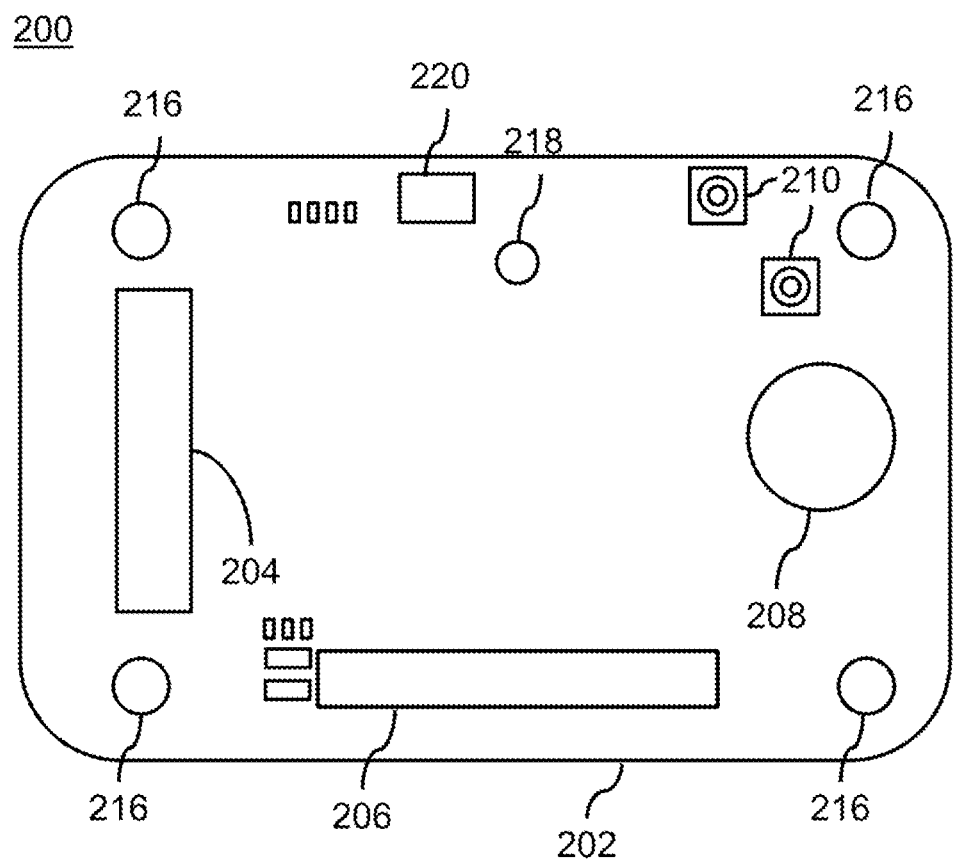
FIG. 2A depicts a top view of a circuit card assembly, in accordance with one or more embodiments of the present disclosure.

Referring now to FIG. 2, a circuit card assembly 200 is described, in accordance with one or more embodiments of the present disclosure. The circuit card assembly 200 may include, but is not limited to, one or more of a circuit card 202, an interface 204 to connect with the host device, an interface 206 to connect with the expansion card, a battery 208, a coaxial radio frequency (RF) connector 210, an antenna 212, or a radome 314. In some instances, the circuit card assembly 200 may be considered as an adapter, an integrated antenna adapter (IAA), or a wireless interface for a host CCA. The circuit card assembly 200 may enable a host device to wireless interface with an avionics network.

The circuit card 202 of the circuit card assembly 200 may include a substrate and one or more integrated circuits provided on the substrate. The circuit card 202 may also include one or more mounting holes 216. The mounting holes 216 may be of a size for receiving and fastening the circuit card assembly 200 to a host device, as will be described further herein. The circuit card 202 may also include a mounting hole 218. The mounting hole may be at a distance from the interface 206. The distance may be selected such that the distance is substantially equal to a distance between the edge connector 102 of the expansion card 100 and a mounting hole of the expansion card. The mounting hole 218 may be of a size for receiving a mounting screw. In this regard, the expansion card 100 may be fastened to the circuit card assembly 200. The circuit card 202 may also include a cable clip 220. One or more components of the circuit card assembly 200 may also be mounted on the circuit card 202. Such components may be communicatively coupled by a trace 222 of the circuit card 202. The specific routing of the trace 222 is not depicted.

The circuit card assembly 200 may further include the interface 204. The interface 204 may be coupled to a first side of the circuit card 202. The interface 204 may provide an interface between the circuit card assembly 200 and a host device. In particular, the interface 204 may provide connectivity to the host device. The interface 204 may be configured to receive a board-to-board connection or a cable connection to the host device. A number of known connectors may be suitable for providing the interface 204, such as, but not limited to, a plug connector, a socket connector, or a board-to-board connector. For example, the interface 204 may include, but is not limited to, a pin header such as a 20-pin socket connector or a 20-pin plug connector. As may be understood, a number of connectors are known in the art which may be suitable for the interface 204. The interface 204 may cause the circuit card assembly 200 to receive power from the host device. For example, the power received may be received from the host device in the form of 24 VDC or 28 VDC. The power may further be provided from the interface 204 to the interface 206 for powering the expansion card 100.

In some embodiments, baseband signals from the host device are received by way of the interface 204. Such baseband signals may be indicative of sensor data from the host device. The baseband signals may be communicated from the interface 204 to the interface 206, by way of one or more communication lines (not depicted). This information may then be processed and modulated by the expansion card 100 into a modulated RF signal for wireless transmission according to a wireless protocol.

The circuit card assembly 200 may further include the interface 206. The interface 206 may be coupled to the first side of the circuit card 202. The interface 206 may be configured to receive and host an edge connector of the expansion card 100. The interface 206 may include any suitable interface for receiving the expansion card 100. A number of known connectors may be suitable for providing the interface 206. For example, the interface 206 may include, but is not limited to, a PCI connector, a PCIe connector, or a mini-PCIe connector, or an M.2 connector. Power may be continually provided to the interface 206 such that the expansion card 100 may power a real-time clock of the expansion card 100. A source of the power continually provided to the interface 206 is selected from the interface 204 and the battery 208 based on an availability of the power from the interface 204. In this regard, the aircraft power may include power cycles. By selectively providing the power based on availability, the real-time clock of the expansion card 100 may retain time information between power cycles of the host device. The power may be selectively provided in a number of suitable methodologies, such as, but not limited to, a power-switch circuitry (not depicted) of the circuit card assembly 200. In some instances, the power-switch is implemented by the interface 204 which acts as an I/O connector.

The power provided to the interface 206 may also cause the expansion card 100 to perform the various radio functions. Thus, although the circuit card assembly 200 may not perform wireless module functions directly, the circuit card assembly 200 may support the wireless module functions for the host device by way of the expansion card 100. The wireless module functions supported may include a radio-frequency module (e.g., radio) of the expansion card 100. In this regard, the circuit card assembly 200 may support radio integration by way of the interface 206. In some embodiments, the interface 206 may further cause the signals received from the host device by way of the interface 204 to be transmitted to the expansion card 100.

The circuit card assembly 200 may also include the battery 208. The battery 208 may be coupled to the first side of the circuit card 202. Power from the battery 208 may be selectively transmitted to the interface 206 based on the availability of the aircraft or host power received by the interface 204. By selectively providing the power from the battery 208, a lifetime of the battery 208 may be extended before requiring replacement. The battery 208 may include any battery known in the art, such as, but not limited to button cell or coin cell.

The circuit card assembly 200 may also include the coaxial radio frequency connectors 210. The coaxial radio frequency connectors 210 may be coupled to the first side of the circuit card 202. By the coaxial radio frequency connectors 210 and the interface 206 being coupled on the same side of the circuit card 202, a length of coaxial cable needed to connect the expansion card 100 to the coaxial radio frequency connectors 210 may be reduced. The coaxial radio frequency connectors 210 may receive modulated radio frequency signals from the expansion card 100. The coaxial radio frequency connectors 210 may further transmit the signal received from the expansion card to the antenna 212. Thus, the coaxial radio frequency connectors 210 provide connectivity between the expansion card 100 and the antenna 212.

The coaxial radio frequency connectors 210 may include any coaxial radio frequency connector known in the art, such as, but not limited to a U.FL connector. The coaxial radio frequency connectors 210 may be surface mounted male connectors. The coaxial radio frequency connectors 210 may further include a given diameter, such as, but not limited to a 2 mm diameter. The coaxial radio frequency connectors 210 may also be configured to receive and transmit signals up to 6 GHz.

The circuit card assembly 200 may also include the antenna 212. The antenna 212 may be coupled to a second side of the circuit card 202. By being disposed on the second side of the circuit card 202, antenna 212 may be separated from the expansion card 100. Such separation may allow the antenna 212 to have a compact profile relative to the circuit card 202. In particular, the circuit card assembly 200 may be coupled to an interior side a host chassis of the host device with minimal modifications to the host chassis. Furthermore, radiation from the antenna 212 may be shielded from the expansion card 100.

The antenna 212 may also be considered an integrated antenna. The antenna of the circuit card assembly 200 reduces the need of antenna selection and qualification by the host device manufacturer. The antenna 212 may include, but is not limited to, a surface mounted antenna, a through-hole mounted antenna, or a printed or etched microstrip antenna.

The antenna 212 may transmit radio waves based on the modulated signal received from the expansion card 100 by way of the coaxial radio frequency connectors 210. As may be understood, wireless interfaces may operate in the ISM (Industrial, Scientific, and Medical) frequency band (2.4 GHz and/or 5 GHz) and/or the Wireless Avionics Intra-communication (WAIC) frequency band (4.2 GHz) for communication with aircraft networks. Such waveforms may further be implemented according to various protocols, such as, but not limited to, Wi-Fi (IEEE 802.11) protocols, Bluetooth (IEEE 802.15.x) protocols, or Cellular (GSM, CDMA, LTE etc.) protocols. The radio waves may cause the circuit card assembly 200 to communicate with a wireless access point of the avionics network. Such communication may include signals received from the host device and/or signals based on sensors within the expansion card 100. By implementing the antenna 212 in the circuit card assembly 200, the designers of the host device may not need to certify the host device for radio frequency functions.

In some embodiments, the circuit card assembly 200 may maintain high voltage isolation when integrating with the host device or the expansion card 100. For example, the antenna 212 may include a ground plane (not depicted). The ground plane may generally include a plane of conductive material. A size of the ground plane may be selected to prevent radiation (e.g., the radio waves emitted by the antenna 212) from reaching the expansion card 100. Thus, the expansion card 100 (or various components of the host device) may be shielded from radiation. Said ground plane may be coupled to a ground wire of the antenna 212.

Figure 2B:
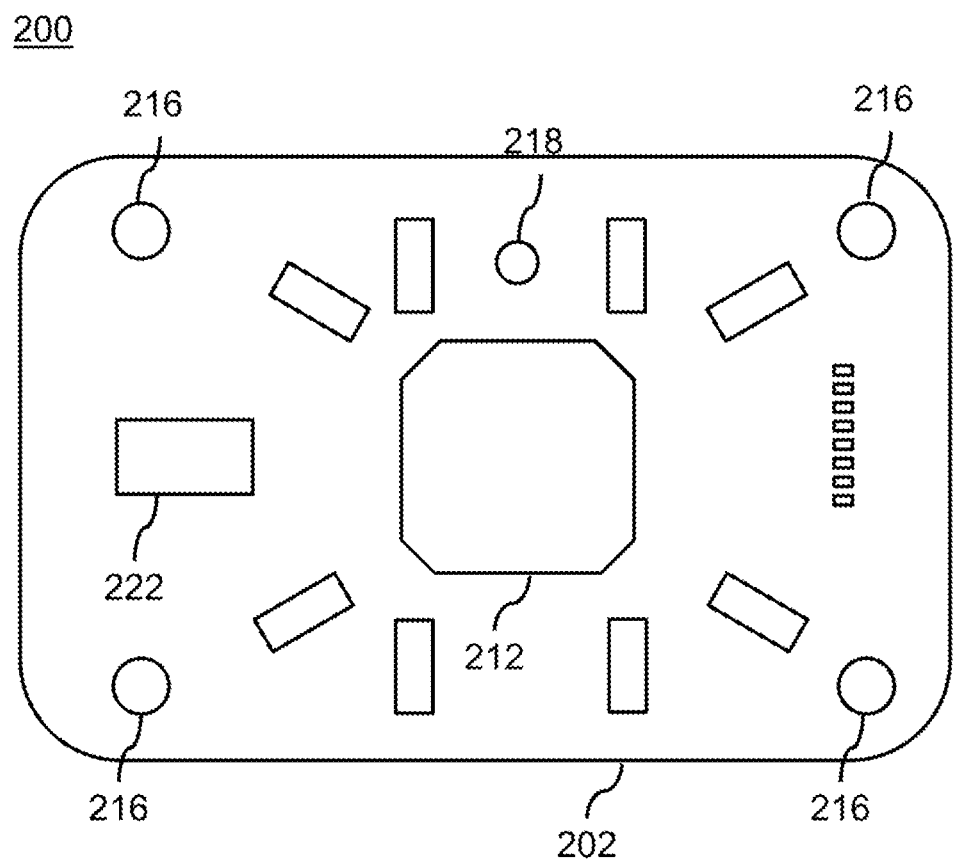
FIG. 2B depicts a bottom view of a circuit card assembly, in accordance with one or more embodiments of the present disclosure.

As depicted in FIG. 2B, the circuit card assembly 200 may include one of the antennas 212. The signals received from both of the coaxial radio frequency connectors 210 may be multiplexed by a multiplexer (not depicted) of the circuit card assembly 200. The multiplexer may multiplex the modulated radio frequency signals received by both of the coaxial radio frequency connectors 210 (see FIG. 2A) into a multiplexed signal. The antenna 212 may then transmit the radio waves based on the multiplexed signal.

Figure 2C:
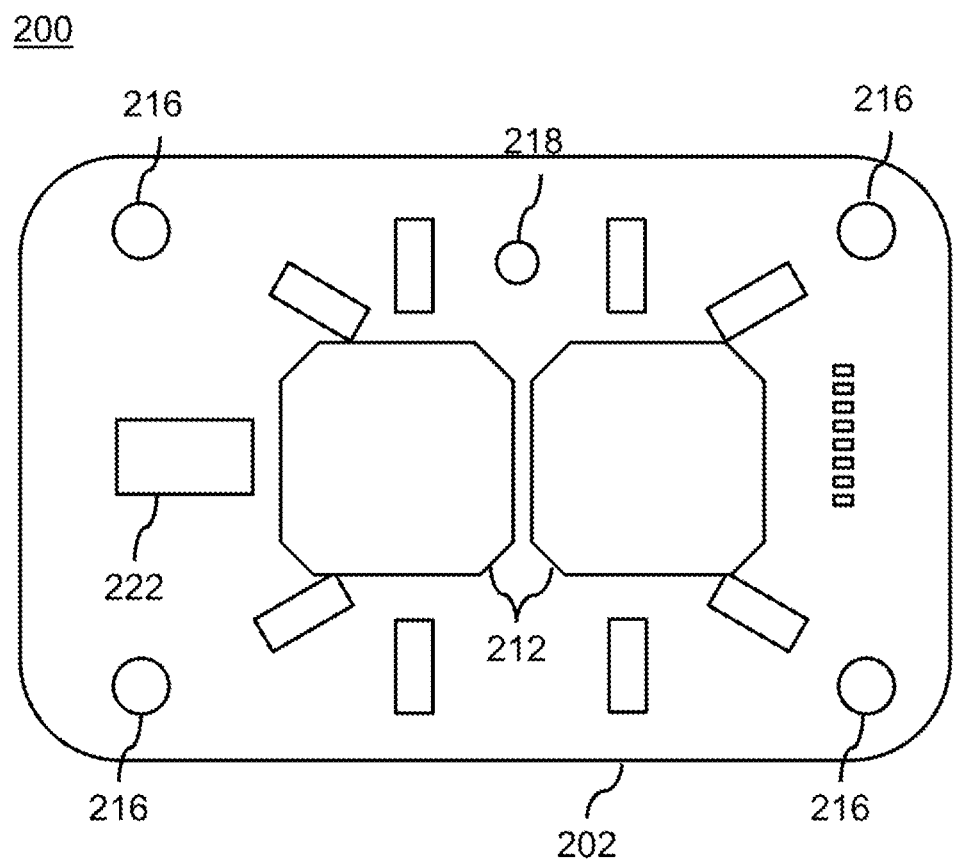
FIG. 2C depicts a bottom view of a circuit card assembly, in accordance with one or more embodiments of the present disclosure.

As depicted in FIG. 2C, the circuit card assembly 200 may include two of the antennas 212. Each of the antennas 212 may be communicatively coupled to one of the coaxial radio frequency connectors. The first and second antennas may then transmit radio waves based on the modulated signals received from the associated radio frequency connector. In this regard, no multiplexer may be required to multiplex the signals for transmission by way of one antenna.

Figure 3A:
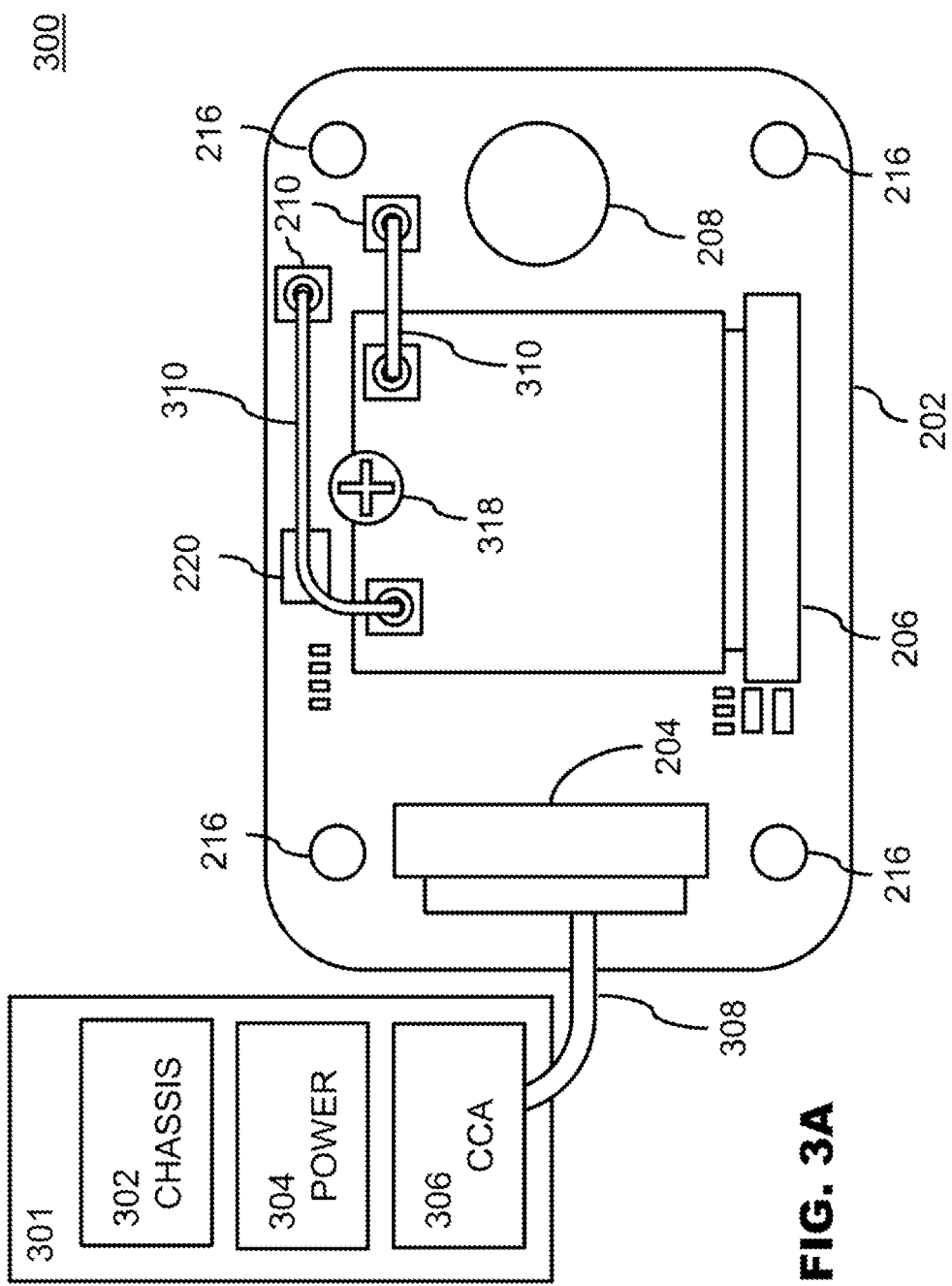
FIG. 3A depicts a simplified schematic of a system, in accordance with one or more embodiments of the present disclosure.
Figure 3B:
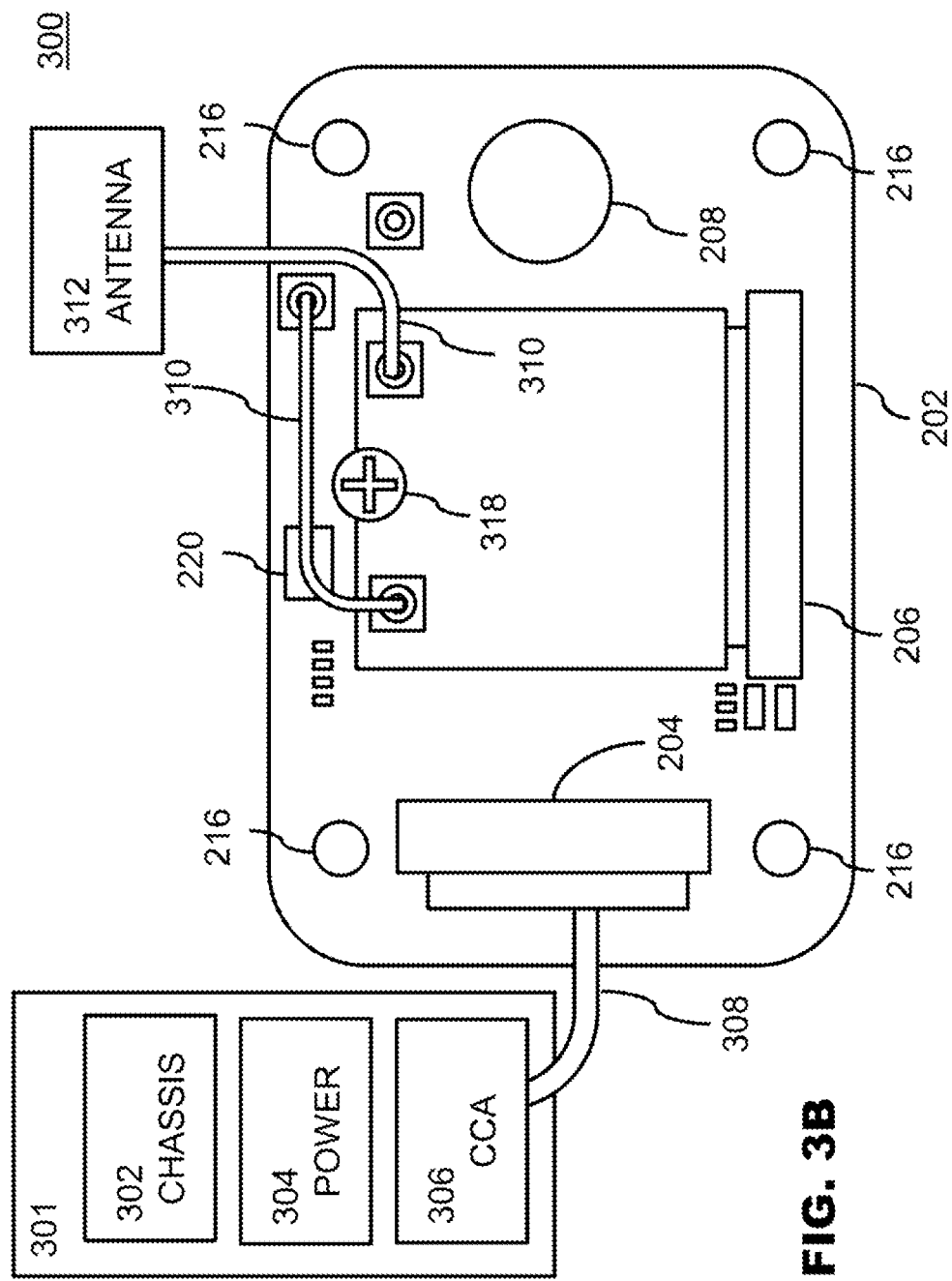
FIG. 3B depicts a simplified schematic of a system, in accordance with one or more embodiments of the present disclosure.
Figure 3C:
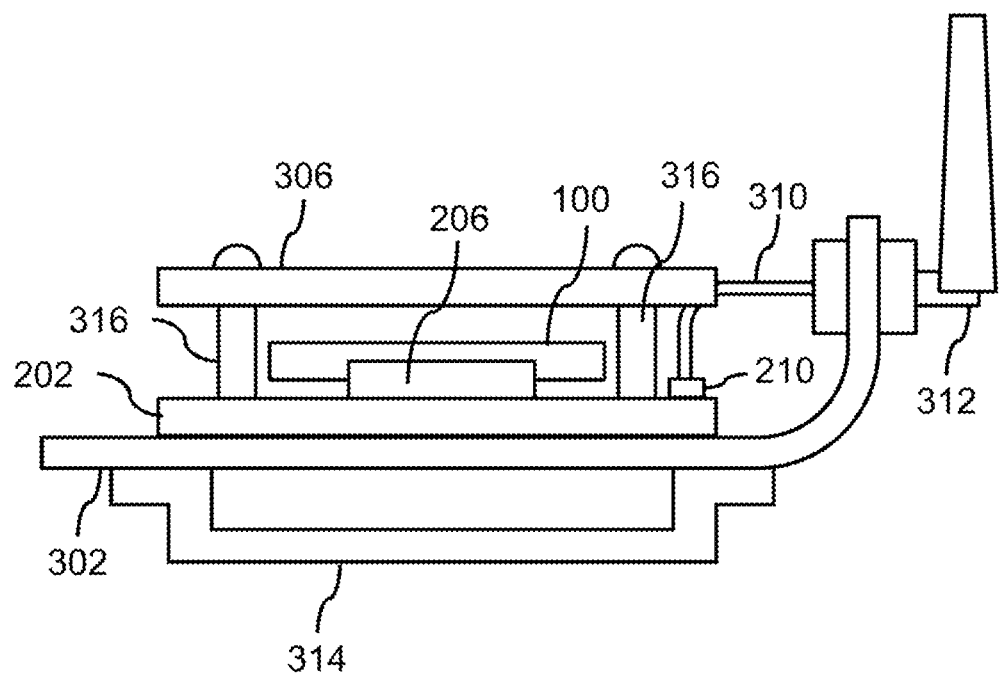
FIG. 3C depicts a side plan view of a system, in accordance with one or more embodiments of the present disclosure.

In some embodiments, the circuit card assembly 200 may further include a radome (see FIG. 3C, for example). The radome may cover the antenna 212 to protect the antenna 212 from external damage. The radome may be transmissible to the radio waves transmitted by the antenna 212. For example, the radome may include a plastic material selected for RF transmissivity with minimal attenuation, such as, but not limited to, polyethereimide (e.g., Ultem™). In some instances, the radome provides a weather proof seal. For example, the radome may include a gasket connection with the host enclosure 302.

Referring now to FIGS. 3A-3C, a system 300 is described, in accordance with one or more embodiments of the present disclosure. The system may include the expansion card 100, circuit card 202, a host device 301, and one or more coaxial cable 310. In this regard, the circuit card 202 and the expansion card 100 may serve as a wireless interface allowing communication between the host device 301 and an access point of an avionics network. By integrating the circuit card assembly 200 with the host device 301, the host device 301 may not need to be certified for communication over the avionics network. The modular nature of the expansion card 100 may include a form factor suitable for the host device 301, thereby reducing costs for development, integration, qualification, and certification. This may be advantageous for implementing the wireless interface to the avionics network in existing host devices. Thus, the circuit card assembly 200 may implement a modular and flexible wireless adapter to host commercially-off-the-shelf (COTS) wireless modules in the host device 301.

The circuit card 202 may adapt the host device 301 with the expansion card 100. The circuit card 202 may receive the expansion card 100 by the interface 206 receiving the edge connector 102. The expansion card 100 may then be fastened to the wireless adapter by the mounting screw 318 and the mounting hole 218, thereby substantially preventing vibration of the expansion card 100. The coaxial RF connectors 210 of the circuit card 202 may be coupled to the coaxial RF connectors 114 of the expansion card 100 by way of the coaxial cable 310. The radio functions of the expansion card 100 may thus cause modulated radio frequency signal to be output to the circuit card 202 by way of the coaxial cable 310, the coaxial RF connector 114, and the coaxial RF connector 210 (e.g., for subsequent transmission by the antenna).

The host device 301 may include any avionics host device known in the art, such as, but not limited to, a galley component (e.g., water heaters, coffee makers, ovens, refrigerator, etc.), a cabin component (e.g., cabin lighting, passenger service units, speakers, flight deck surveillance systems, etc.), a seating component (e.g., a seat control unit, passenger compartment controller, etc.), or other suitable device coupled to aircraft power. The host device 301 may include one or more of a host chassis 302, a power supply 304, and a host circuit card assembly 306.

The host device 301 may include the host chassis 302. The host chassis 302 may include any material known in the art. In some instances, the host chassis 302 may include an EMI resistant material, such as metal. In this regard, the host chassis 302 may act as an EMI shield for the host circuit card assembly. In other instances, the host chassis 302 may include a non-EMI resistant material, such as plastic. The host chassis 302 may be modified to include an aperture (not depicted). The aperture may permit transmission of the radio waves. The aperture may provide the antenna 212 of the circuit card assembly 200 with a transmission region by which radio waves may be transmitted to transmit to the avionics network. The aperture may be selected with a given size suitable for the radio waves. In some embodiments, the aperture is selected based on the size of the antenna 212. For example, the aperture may include a square or round hole with dimensions selected based on the dimensions of the antenna 212 (e.g., a square hole with a width of 1.5 inches). Thus, the antenna 212 may radiate outside of the host chassis 302. The introduction of the aperture to the host chassis 302 may also permit external radio waves to pass through the aperture. In some instances, the external radio waves are absorbed by the ground plane of the antenna 212, thereby preventing interference with the host circuit card assembly 306 and the expansion card 100.

The circuit card assembly 200 may be mounted to the interior of the host chassis 302. The circuit card assembly 200 may be mounted to the interior of the host chassis 302 in any orientation that supports the installation. For example, where the host circuit card assembly 306 and the circuit card assembly 200 are connected by a cable interconnect, the cable may be flexible run from the host circuit card assembly 306 to the desired mounting location for the circuit card assembly 200. By way of another example, where the host circuit card assembly 306 and the circuit card assembly 200 are board-to-board connected, the circuit card assembly 200 may be mounted to the interior of the host chassis 302 in a suitable orientation based on the board-to-board connection.

The host device 301 may also include a power supply 304. The power supply 304 may include any suitable power supply known in the art. In this regard, any distributed or local power supply that provides conditioned power suitable for implementation in the context of avionics (e.g., 28 VDC) capable of meeting the requirements of the host device 301 may be implemented. In some instances, the power from the power supply 304 includes a duty or power cycle based on the type of the host device 301.

The host device 301 may also include the host circuit card assembly 306. The host circuit card assembly 306 may include any host circuit card assembly known in the art. The host circuit card assembly 306 may be mounted to the host chassis 302. In some instances, the circuit card assembly 200 may be mounted to the host circuit card assembly 306 by one or more standoffs.

The host circuit card assembly 306 may also be communicatively coupled to the circuit card assembly 200. The host circuit card assembly 306 may include an interface. The interface may communicatively couple the host circuit card assembly 306 with the circuit card assembly 200. The interface may include any interface, such as, but not limited. a plug connector, a socket connector, or a board-to-board connector. In some embodiments, the interface 204 and the interface are coupled by a cable 308. The cable 308 may include any cable known in the art, such as, but not limited to, a pigtail connector, a cable connector, a cable harness, or other suitable cable. The cable may be selected based on the interface of the host circuit card assembly 306. The circuit card assembly 200 may include multiple mounting locations within the host chassis 302. By the cable, the circuit card assembly 200 is flexible in mounting location and orientation for both forward-fit and retro-fit installations within the chassis 302. In some embodiments, the interface 204 and the interface are coupled by a board-to-board connection (not depicted) without a cable.

In some embodiments, the host circuit card assembly 306 may output power from the power supply 304 to the circuit card assembly 200. The power may be output by way of the interface. The circuit card assembly 200 may then selectively provide power to the expansion card 100 for persistently preserves time between power cycles of the aircraft power received. As may be understood, the system 300 may include a number of the host device 301 on the aircraft. In this regard, such host devices may not include a physical network interface but may include aircraft power. An ability to wireless interface the host device 301 with the aircraft network by way of the circuit card assembly 200 may be desirable.

In some embodiments, the host circuit card assembly 306 may output baseband signals to the circuit card assembly 200. The baseband signals may include real-time clock data. Such real-time clock data may be provided to the expansion card 100 for time-synchronization with the real-time clock of the expansion card 100. The baseband signals may also include sensor data from the host device 301. The host circuit card assembly 306 may also include more than one of the interfaces. For example, a first interface may provide the power and a second interface may provide the baseband sensor signal.

Referring now to FIG. 3B, the system 300 may further include an antenna 312. The antenna may be mounted to an exterior of the host chassis 302. The antenna 312 may include any antenna, such as, but not limited to, a patch antenna or a whip antenna. The antenna 312 may be coupled to one of the coaxial radio frequency connectors 210 by way of the coaxial cable 310. Thus, the antenna 312 and the antenna 212 may transmit the radio waves to the wireless aircraft network.

Referring now to FIG. 3C, the system 300 may further include a radome 314. The radome 314 may cover the antenna 212 to protect the antenna 212 from external damage. The radome may be transmissible to the radio waves transmitted by the antenna 212. For example, the radome may include a plastic material selected for RF transmissivity with minimal attenuation, such as, but not limited to, polyethereimide (e.g., Ultem™). In some instances, the radome provides a weather proof seal. For example, the radome may include a gasket connection with the host enclosure 302.

The host chassis 302 may include an aperture. The circuit card assembly 200 may be mounted to the host chassis such that the antenna 212 transmits the radio waves through the aperture. For example, the antenna may be disposed within the aperture. The radome 314 may also cover the aperture.

The system 300 may also include one or more standoffs 316. The standoffs 316 may couple one or more of the circuit card assembly 200, the host circuit assembly 306, the host chassis 302, and the radome 314.

Referring generally again to FIGS. 1A-3C.

As previously described, the circuit card assembly 200 may adapt the host circuit card assembly 306 with the expansion card 100. It is further contemplated that the circuit card assembly 200 may include one or more radio functions embedded within the circuit card assembly 200, such that the expansion card 100 is not necessary. In this regard, although the circuit card assembly 200 is described as including one or more of an interface 206 and a coaxial radio frequency connector 210, this is not intended as a limitation on the present disclosure. In some embodiments, the circuit card assembly 200 may include the circuit card 202, the interface 204, the antenna 212. The circuit card assembly 200 may further include a radio disposed on the first side of the circuit card 202. The radio may be coupled to the interface 204 for receiving power and various unmodulated signals. The radio may be configured to generate modulated radio frequency signals by executing a radio modulation functions. The radio may also be communicatively coupled to the antenna 212, causing the antenna 212 to transmit radio waves based on the modulated radio frequency signal.

From the above description, it is clear that the inventive concepts disclosed herein are well adapted to carry out the objectives and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A circuit card assembly adapting a host circuit card assembly of a host device with an expansion card for communication to an access point of an avionics network, the circuit card assembly comprising:
    a circuit card including a first side, a second side opposite to the first side, and a plurality of mounting holes for mounting the circuit card assembly to a host chassis of the host device;
    a first interface disposed on the first side of the circuit card for receiving power from the host circuit card assembly;
    a second interface disposed on the first side of the circuit card for receiving an edge connector of the expansion card, wherein the power is continually provided to the second interface for powering a real-time clock of the expansion card, wherein the second interface is a socket connector;
    at least one coaxial radio frequency connector disposed on the first side of the circuit card for receiving a modulated radio frequency signal modulated by a radio-frequency module of the expansion card; and
    an antenna disposed on the second side of the circuit card and communicatively coupled to the at least one coaxial radio frequency connector, the antenna transmitting radio waves based on the modulated radio frequency signal.

2. The circuit card assembly of claim 1, wherein the first interface further receives a baseband signal indicative of sensor data from the host device; wherein the baseband signal is communicated from the first interface to the second interface for modulating the baseband signal into the modulated radio frequency signal according to a wireless protocol.

3. The circuit card assembly of claim 1, the first interface is one of a plug connector, a second socket connector, or a board-to-board connector.

4. The circuit card assembly of claim 3, wherein the second interface is one of a PCI connector, a PCIe connector, or a mini-PCIe connector, or an M.2 connector; wherein the at least one coaxial radio frequency connector is a U.FL connector; wherein the antenna is one of surface mounted, through-hole mounted, or a printed microstrip antenna.

5. The circuit card assembly of claim 1, wherein the radio waves are transmitted according to one of a Wi-Fi network protocol or a Bluetooth Low Energy network protocol.

6. The circuit card assembly of claim 1, the circuit card further includes a screw hole for fastening the expansion card to the circuit card, a distance between the screw hole and the second interface substantially equal to a distance between the edge connector of the expansion card and a mounting hole of the expansion card.

7. The circuit card assembly of claim 1, further comprising:
    a second coaxial radio frequency connector for receiving a second modulated radio frequency signal from the radio-frequency module of the expansion card; and
    a second antenna communicatively coupled to the second coaxial radio frequency connector, the second antenna transmitting radio waves based on the second modulated radio frequency signal.

8. The circuit card assembly of claim 1, further comprising:
    a second coaxial radio frequency connector for receiving a second modulated radio frequency signal from the radio-frequency module of the expansion card; and
    a multiplexer multiplexing the modulated radio frequency signal and the second modulated radio frequency signal into a multiplexed signal, the antenna transmitting radio waves based on the multiplexed signal.

9. The circuit card assembly of claim 1, further comprising a battery disposed on the first side of the circuit card; wherein a source of the power continually provided to the second interface is selected from the first interface and the battery based on an availability of the power from the first interface.

10. A system for communication to an access point of an avionics network, the system comprising:
    a host device including a host chassis and a host circuit card assembly fixed to the host chassis, the host circuit card assembly receiving aircraft electrical power;
    an expansion card including an edge connector, a real-time-clock, a radio-frequency module, and a first coaxial radio frequency connector, wherein the radio frequency module is configured to generate a modulated radio frequency signal, wherein the modulated radio frequency signal is output by way of the first coaxial radio frequency connector;
    a coaxial cable; and
    a circuit card assembly including:
        a circuit card including a first side, a second side opposite to the first side, and a plurality of mounting holes by which the circuit card is mounted to the host chassis;
        a first interface disposed on the first side of the circuit card for receiving power from the host circuit card assembly;
        a second interface disposed on the first side of the circuit card for receiving the edge connector of the expansion card, wherein the power is continually provided to the second interface for powering the real-time clock;

a second coaxial radio frequency connector disposed on the first side of the circuit card, wherein the first coaxial radio frequency connector and the second coaxial radio frequency connector are coupled by the coaxial cable such that the second coaxial radio frequency connector receives the modulated radio frequency signal from the radio-frequency module; and an antenna disposed on the second side of the circuit card and communicatively coupled to the second coaxial radio frequency connector, the antenna transmitting radio waves based on the modulated radio frequency signal.

11. The system of claim 10, further comprising an antenna mounted to an exterior surface of the chassis, wherein the antenna is communicatively coupled to a third coaxial radio frequency connector of the circuit card assembly by way of a second coaxial cable.

12. The system of claim 10, wherein the host chassis includes an aperture, wherein the circuit card assembly is mounted to the host chassis such that the antenna transmits the radio waves through the aperture.

13. The system of claim 12, further comprising a radome covering the aperture and the antenna.

14. The system of claim 13, wherein the circuit card assembly, the host circuit assembly, the host chassis, and the radome are coupled by a plurality of standoffs.

15. The system of claim 10, wherein the circuit card assembly further comprises a battery disposed on the first side of the circuit card; wherein a source of the power continually provided to the second interface is selected from the first interface and the battery based on an availability of the power from the first interface.

* * * * *